(12) United States Patent
Chen et al.

(10) Patent No.: US 11,251,273 B2
(45) Date of Patent: Feb. 15, 2022

(54) NON-VOLATILE MEMORY DEVICE AND METHOD FOR MANUFACTURING THE SAME

(71) Applicant: Winbond Electronics Corp., Taichung (TW)

(72) Inventors: Jian-Ting Chen, Tainan (TW);
Yao-Ting Tsai, Kaohsiung (TW);
Jung-Ho Chang, Yunlin County (TW);
Hsiu-Han Liao, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 95 days.

(21) Appl. No.: 16/521,311

(22) Filed: Jul. 24, 2019

(65) Prior Publication Data
US 2020/0035794 A1   Jan. 30, 2020

(30) Foreign Application Priority Data
Jul. 24, 2018  (TW) .................................. 107125497

(51) Int. Cl.
*H01L 21/28* (2006.01)
*H01L 27/11521* (2017.01)
(Continued)

(52) U.S. Cl.
CPC ... *H01L 29/40114* (2019.08); *H01L 21/31111* (2013.01); *H01L 21/31144* (2013.01);
(Continued)

(58) Field of Classification Search
CPC ......... H01L 29/40114; H01L 27/11521; H01L 29/42324; H01L 27/11531;
(Continued)

(56) References Cited

U.S. PATENT DOCUMENTS

| 7,541,240 B2 * | 6/2009 | Pham .................. H01L 21/3212 |
| | | 438/257 |
| 8,124,488 B2 | 2/2012 | Chiang et al. |

(Continued)

FOREIGN PATENT DOCUMENTS

| CN | 101924078 | 10/2012 |
| EP | 0843353 | 5/1998 |
| KR | 20080050772 | 6/2008 |

*Primary Examiner* — Shahed Ahmed
*Assistant Examiner* — Sun Mi Kim King
(74) *Attorney, Agent, or Firm* — Muncy, Geissler, Olds & Lowe, P.C.

(57) ABSTRACT

A non-volatile memory device and its manufacturing method are provided. The method includes the following steps. A plurality of isolation structures are formed in a substrate. A first polycrystalline silicon layer is formed in the substrate and between two adjacent isolation structures. A first implantation process is performed to implant a first dopant into the first polycrystalline silicon layer and the isolation structures. A portion of each of the isolation structures is partially removed, and the remaining portion of each of the isolation structures has a substantially flat top surface. An annealing process is performed after partially removing the isolation structures to uniformly diffuse the first dopant in the first polycrystalline silicon layer. A dielectric layer is formed on the first polycrystalline silicon layer, and a second polycrystalline silicon layer is formed on the dielectric layer.

12 Claims, 6 Drawing Sheets

(51) Int. Cl.
  *H01L 27/11531* (2017.01)
  *H01L 29/423* (2006.01)
  *H01L 29/66* (2006.01)
  *H01L 21/3215* (2006.01)
  *H01L 21/311* (2006.01)
  *H01L 29/788* (2006.01)
  *H01L 29/49* (2006.01)

(52) U.S. Cl.
  CPC .. *H01L 21/32155* (2013.01); *H01L 27/11521* (2013.01); *H01L 27/11531* (2013.01); *H01L 29/42324* (2013.01); *H01L 29/4916* (2013.01); *H01L 29/66825* (2013.01); *H01L 29/7883* (2013.01)

(58) Field of Classification Search
  CPC . H01L 21/762–76237; H01L 29/66825; H01L 21/32155; H01L 21/31111; H01L 21/31144; H01L 29/7883; H01L 29/4916; H01L 27/11548
  See application file for complete search history.

(56) References Cited

U.S. PATENT DOCUMENTS

| | | | |
|---|---|---|---|
| 8,133,777 B1 | 3/2012 | Chiang et al. | |
| 2012/0007162 A1* | 1/2012 | Lee | H01L 27/11521 257/315 |
| 2019/0319037 A1* | 10/2019 | Liu | H01L 27/11531 |

* cited by examiner

NON-VOLATILE MEMORY DEVICE AND METHOD FOR MANUFACTURING THE SAME

CROSS REFERENCE TO RELATED APPLICATIONS

This Application claims priority of Taiwan Patent Application No. 107125497, filed on Jul. 24, 2018, the entirety of which is incorporated by reference herein.

BACKGROUND

Field of the Disclosure

The present disclosure relates to a memory device, and in particular it relates to a non-volatile memory device and a method for manufacturing the non-volatile memory device.

Description of the Related Art

Non-volatile memory can be divided into two categories, depending on whether data in memory can be rewritten at any time during the operation of a computer. Namely, these two categories are termed read-only memory and flash memory. Of the two, flash memory has gradually become the mainstream of non-volatile memory because of its lower cost.

With the recent trend toward miniaturization of electronic products, there is a demand for the miniaturization of flash memories as well. Therefore, there is still a need for flash memories which have high reliability and yield.

BRIEF SUMMARY

The disclosure provides a method for manufacturing a non-volatile memory device. The method includes forming a plurality of isolation structures in a substrate, forming a first polycrystalline silicon layer in the substrate and between two adjacent isolation structures, and performing a first implantation process to implant a first dopant into the first polycrystalline silicon layer and the isolation structures. The method also includes partially removing a portion of each of the isolation structures so that a remaining portion of each of the isolation structures has a substantially flat top surface. The method also includes performing an annealing process to diffuse the first dopant in the first polycrystalline silicon layer uniformly after partially removing the isolation structures. The method also includes forming a dielectric layer on the first polycrystalline silicon layer and forming a second polycrystalline silicon layer on the dielectric layer.

The disclosure also provides a non-volatile memory device. The non-volatile memory device includes a plurality of isolation structures formed in a substrate. Each of the isolation structures has a substantially flat top surface. The non-volatile memory device also includes a first polycrystalline silicon layer formed on the substrate and between two adjacent isolation structures. The non-volatile memory device also includes a dielectric layer formed on the first polycrystalline silicon layer. The non-volatile memory device also includes a second polycrystalline silicon layer formed on the dielectric layer.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

Figure 1A:
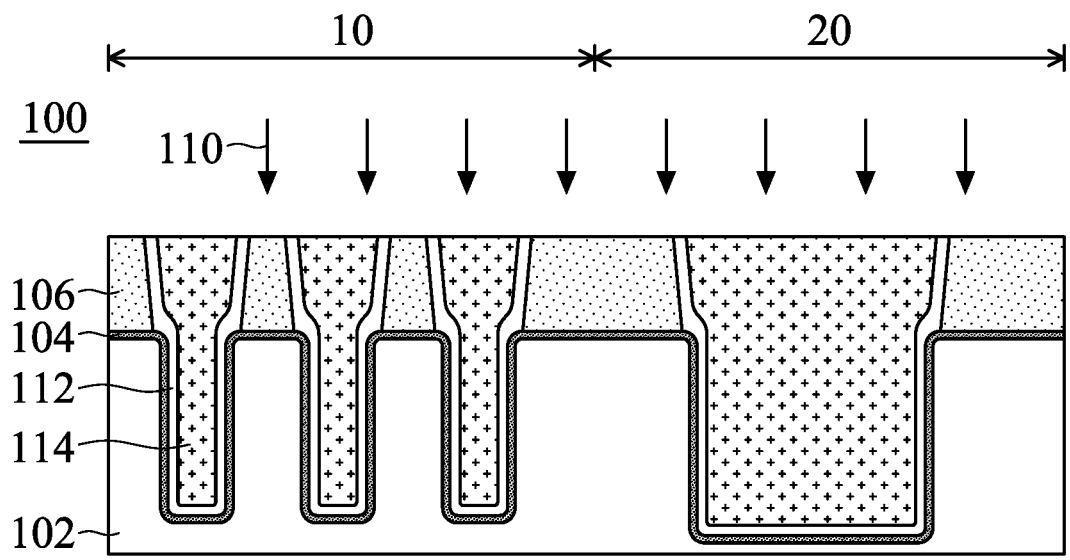
FIGS. 1A-1I show cross-sectional views showing various steps of manufacturing a non-volatile memory device in accordance with some embodiments.

The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

In the disclosure, the term "about" means in a range of 20% of a given value or range, preferably 10%, and more preferably 5%. In the disclosure, if there is no specific explanation, a given value or range means an approximate value which may imply the meaning of "about".

A non-volatile memory device and its manufacturing method are provided in the present disclosure. FIGS. 1A-1I show cross-sectional views showing various steps of manufacturing a non-volatile memory device 100 in accordance with some embodiments.

Referring to FIGS. 1A-1D, a plurality of isolation structures are formed in the substrate 102. The substrate 102 may include an array region 10 and a peripheral region 20 adjacent to the array region 10. In some embodiments, the substrate 102 may be a semiconductor substrate. In some embodiments, the material of the substrate 102 may include silicon, gallium arsenide, gallium nitride, silicon germanium, silicon on insulator (SOI), another suitable material, or a combination thereof. In some embodiments, other structures may be formed in the substrate 102. In this embodiment, the substrate 102 is a silicon substrate.

Referring to FIG. 1A, first, a thermal oxidation process is performed to form a tunnel oxide layer 104 on the surface of the substrate 102. Then, a sacrificial layer 106 is formed on the substrate 102, and the sacrificial layer 106 and the substrate 102 are patterned to form a plurality of trenches in the substrate 102. The thermal oxidation process may optionally be performed again to conformally form the tunnel oxide layer 104 in the plurality of trenches. Then, an insulating liner 112 is conformally formed in the plurality of trenches. Then, a first insulating material 114 is formed and filled in the plurality of trenches. Then, a planarization process (for example, a chemical mechanical polishing process, CMP) is performed, so that the top surface of the sacrificial layer 106, the top surface of the insulating liner 112, and the top surface of the first insulating material 114 are level with one another. Then, an implantation process 110 is performed to implant the second dopant in the insulating liner 112 and the first insulating material 114.

Figure 1B:
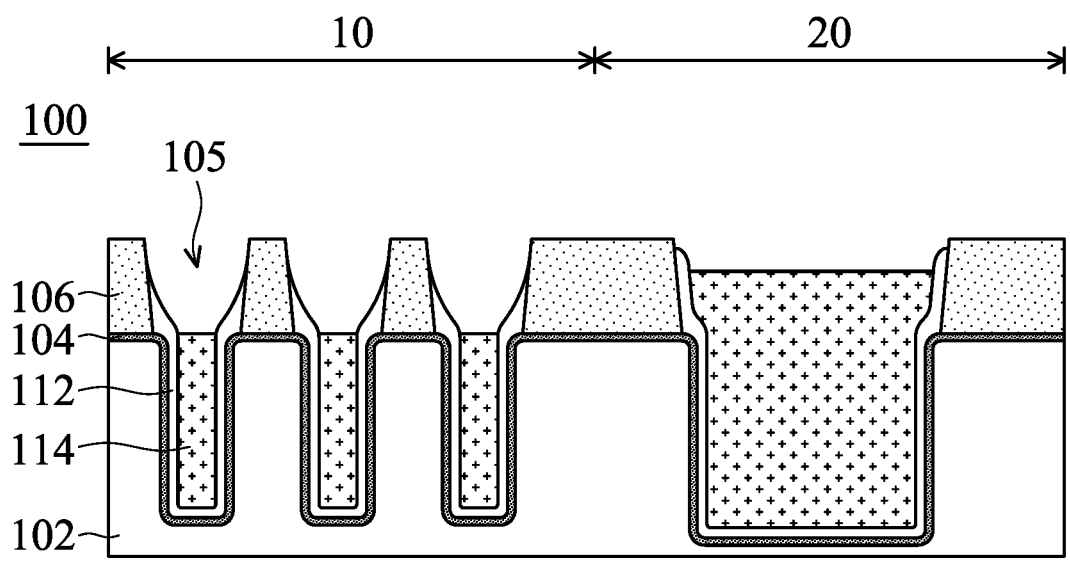

Referring to FIG. 1B, after the implantation process 110 is performed, the insulating liner 112 and the first insulating material 114 are partially removed by an etching process to form a plurality of first recesses 105 in the sacrificial layer 106. In some embodiments, the etching process used to form the first recesses 105 may be a dry etching process, a wet etching process, or a combination thereof. During this etching process, the sacrificial layer 106 has a small etching rate and thus is hardly removed. Furthermore, during this etching process, the etching rate of the first insulating material 114 is greater than the etching rate of the insulating liner 112. Therefore, a portion of the insulating liner 112 remains on the sidewalls of the first recess 105. Furthermore, the width of the first insulating material 114 in the peripheral region 20 is much larger than the width of the first insulating material 114 in the array region 10. Therefore, due to the effect of the loading effect, the depth of the first recess 105 in the peripheral region 20 may be less than the depth of the first recess 105 in the array region 10, as shown in FIG. 1B.

Figure 1C:
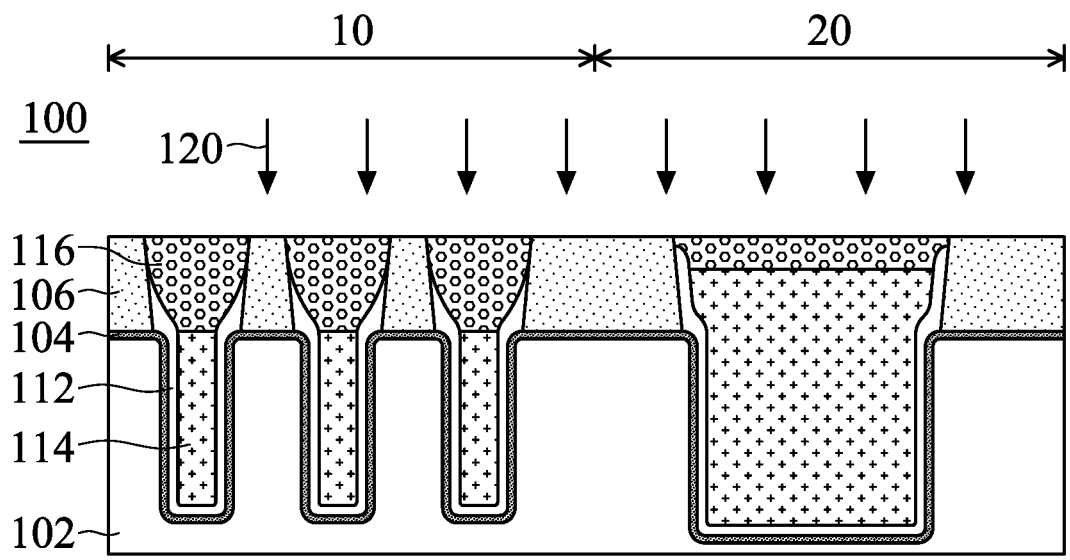

Referring to FIG. 1C, a second insulating material 116 is formed in the first recess 105. Then, an implantation process 120 is performed to implant a third dopant into the second insulating material 116.

Figure 1D:
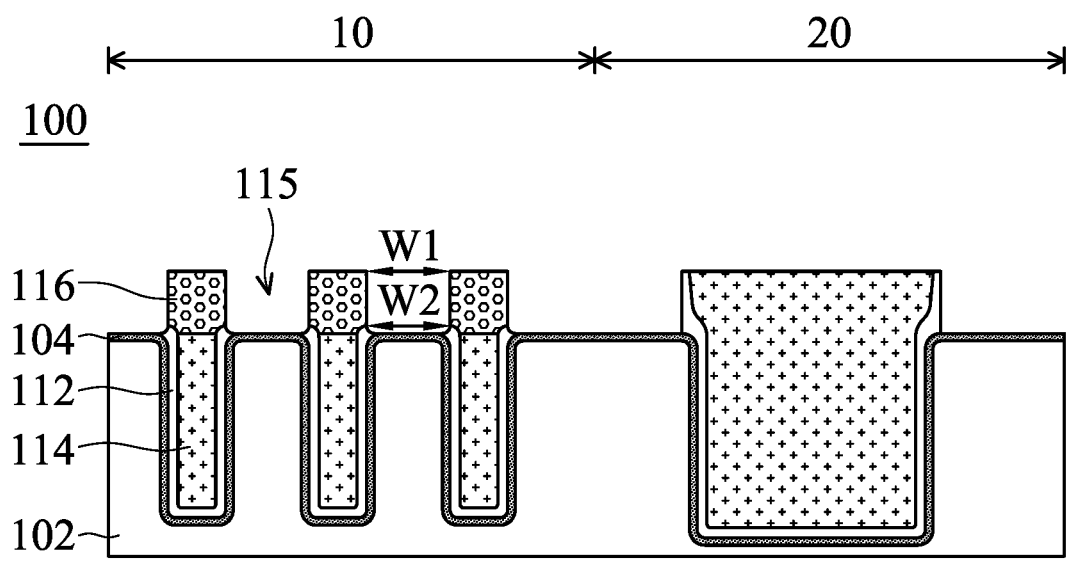

Referring to FIG. 1D, after the implantation process 120 is performed, the sacrificial layer 106 is removed by an etching process, and the insulating liner 112 and the second insulating material 116 are partially removed to form a plurality of second recesses 115 and a plurality of isolation structures. Each of the second recesses 115 is located between two isolation structures. In some embodiments, the second recesses 115 are formed by a dry etching process. Each of the isolation structures includes the insulating liner 112 and the first insulating material 114. In this embodiment, the second insulating material 116 in the peripheral region 20 is completely removed by using the first insulating material 114 as an etch stop layer. Because the thickness of the second insulating material 116 in the array region 10 is thicker, the second insulating material 116 in the array region 10 is not completely removed. In other words, each of the isolation structures in the array region 10 further includes the second insulating material 116. However, in other embodiments, the second insulating material 116 in the peripheral region 20 is not completely removed.

Figure 1E:
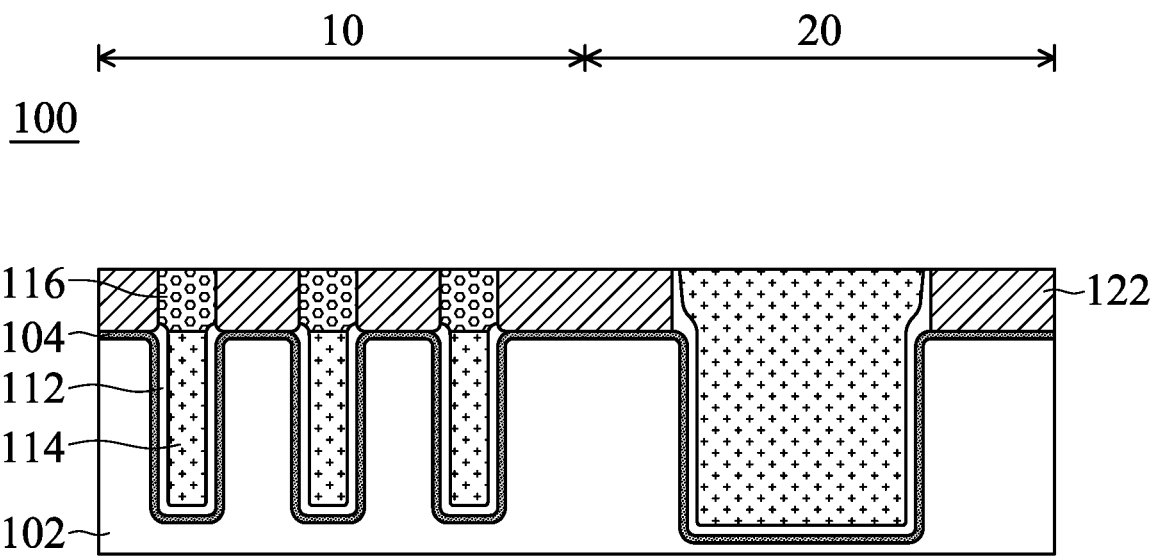

Referring to FIG. 1E, a first polycrystalline silicon layer 122 is formed between adjacent isolation structures. More specifically, this step may include depositing polycrystalline silicon on the substrate 102 so as to fill the second recesses 115 by a deposition process, and removing the polycrystalline silicon outside the second recesses 115 by a planarization process (such as CMP). The deposition process may include a chemical vapor deposition process, an atomic layer deposition process, or a combination thereof.

Figure 1F:
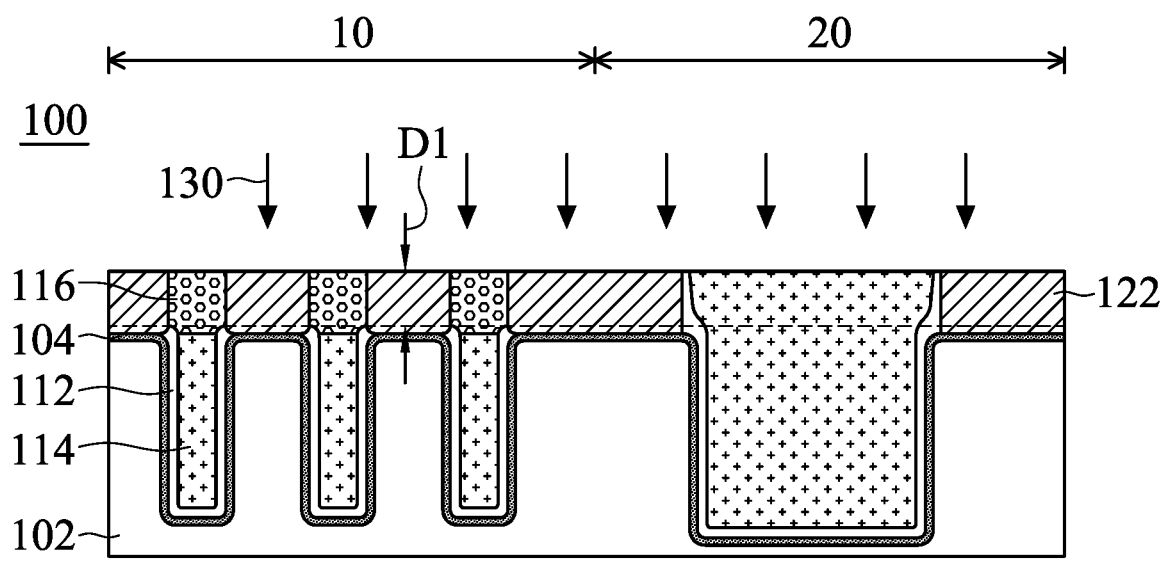

Referring to FIG. 1F, an implantation process 130 is performed to implant the first dopant into the first polycrystalline silicon layer 122 and the isolation structures. After the implantation process 130, the first dopant has a maximum concentration at the location of the first depth D1 of the first polycrystalline silicon layer 122 and the isolation structures (as indicated by the dashed line in FIG. 1F). In this embodiment, the first dopant has a maximum concentration in the second insulating material 116 of the isolation structure.

Figure 1G:
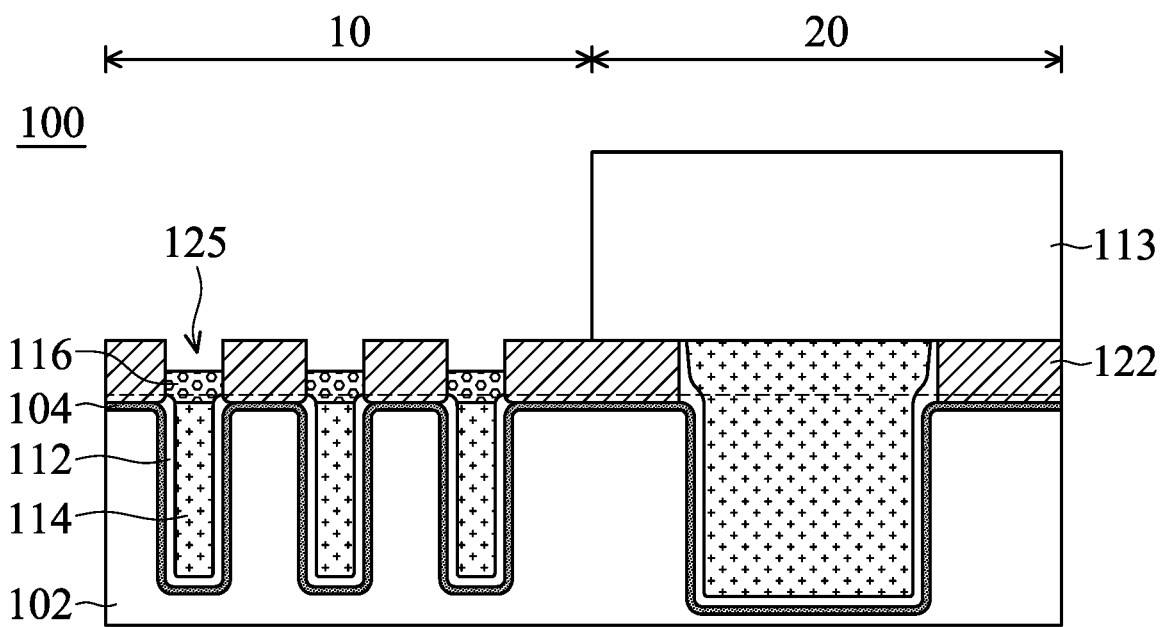

In order to increase the coupling ratio, the top surface of the isolation structure in the peripheral region 20 may be higher than the top surface of the isolation structure in the array region 10. Referring to FIG. 1C a mask layer 113 is formed to cover the peripheral region 20, and the array region 10 is exposed. Then, a first etching process is performed to partially remove the second insulating material 116 in the array region 10 such that the top surface of the isolation structure located in the array region 10 is higher than the first depth D1. In other embodiments, the process steps as shown in FIG. 1G may be omitted.

Figure 1H:
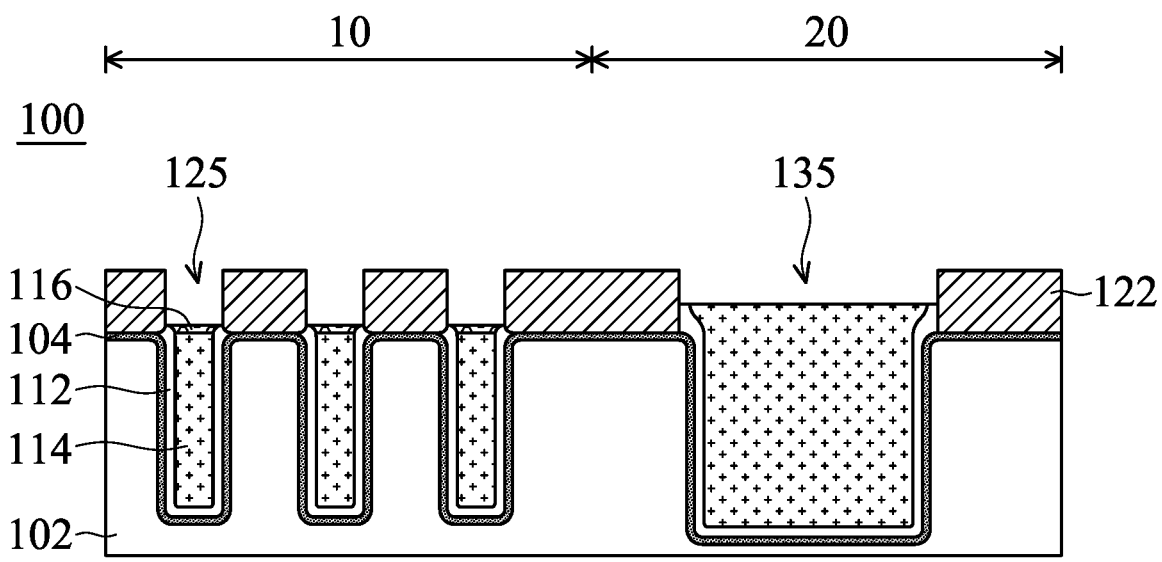

Referring to FIG. 1H, the mask layer 113 is removed. Then, a second etching process is performed to partially remove the second insulating material 116, and third recesses 125 and fourth recesses 135 respectively located in the array region 10 and the peripheral region 20 are formed on the isolation structures. In some embodiments, the first etching process and the second etching process are dry etching processes. As a result, each isolation structure in the array region 10 has a top surface that is substantially flat and is substantially level with the first depth D1, and the top surface of the isolation structure in the peripheral region 20 is higher than the top surface of the isolation structure in the array region 10.

In some embodiments, after the second etching process is performed, an annealing process is performed to uniformly diffuse the first dopant into the first polycrystalline silicon layer 122. After the annealing process, the electrical resistance value of the first polycrystalline silicon layer 122 is reduced, and the first polycrystalline silicon layer 122 may be used as a floating gate.

Figure 1I:
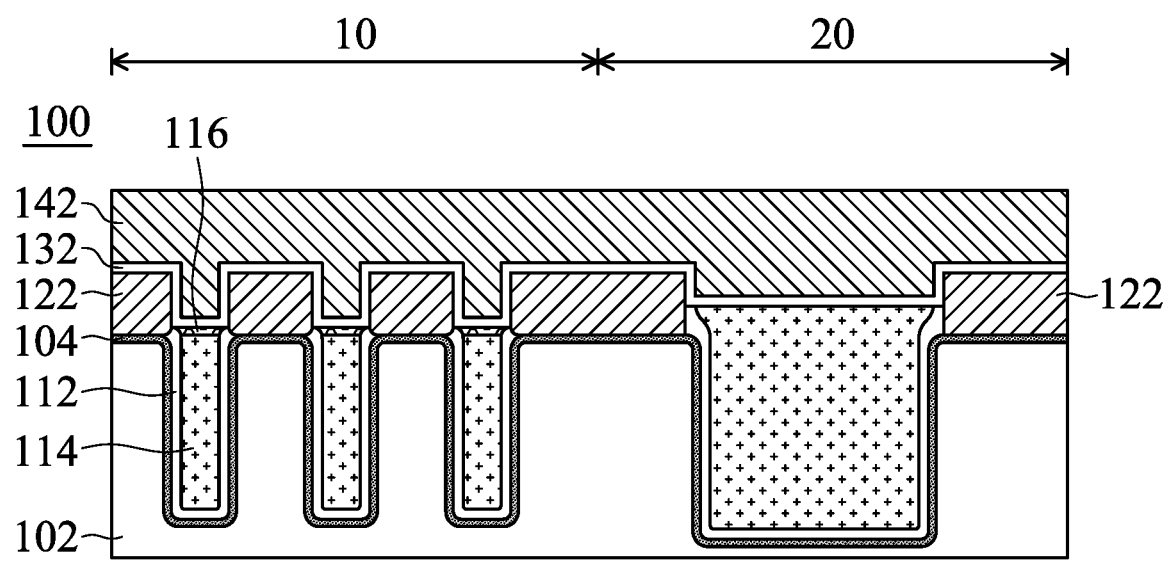

Referring to FIG. 1I, a dielectric layer 132 is conformally formed on the first polycrystalline silicon layer 122. Then, a second polycrystalline silicon layer 142 is formed on the dielectric layer 132. In some embodiments, an implantation process and an annealing process may be performed on the second polycrystalline silicon layer 142 to reduce the electrical resistance value of the second polycrystalline silicon layer 142, and therefore the second polycrystalline silicon layer 142 may be used as a control gate. Thereafter, other conventional processes (for example, patterning the floating gates and the control gates) may be performed to complete the non-volatile memory device 100. These conventional processes are not described in detail herein.

In order to exert a good electrical insulating effect, the insulating liner 112, the first insulating material 114, and the second insulating material 116 may be nitrides, oxides, oxynitrides, other suitable insulating materials, or combinations thereof. Furthermore, in order to form the first polycrystalline silicon layer 122 self-aligned between the isolation structures, the sacrificial layer 106 and the isolation structure have a high etching selectivity.

In some embodiments, the insulating liner 112, the first insulating material 114, and the second insulating material 116 are different oxides, and the sacrificial layer 106 is a nitride. In some embodiments, in order to effectively fill a trench having a high aspect ratio (for example, an aspect ratio greater than 10) without leaving a void, the first insulating material 114 may be a spin-on glass (SOG). However, although the spin-on glass has good hole-filling ability, the impurities therein such as a polymer may adversely affect the tunneling oxide layer 104. By forming the insulating liner 112 between the first insulating material 114 and the tunneling oxide layer 104, the yield can be further improved. Furthermore, in order to improve the insulating properties of the isolation structures, the first recesses 105 may be filled with the second insulating material 116 that includes insulating material having a relatively high hardness. In some embodiments, the second insulating material 116 may be a high density oxide. Therefore, the second insulating material 116 is more resistant to the etching process used for forming the second recesses 115, so as to protect the underlying first insulating material 114.

In some embodiments, after the first insulating material 114 is filled into the trench, the hardness of the first insulating material 114 is further increased by a hardening process. However, the degree of hardening of the corners of the first insulating material 114 is generally poor, so that the bottom surface of the subsequently formed first recess 105 is not flat. In order words, the top surface of the first insulating material 114 in FIG. 1B is relative low in the periphery thereof. As a result, it will be difficult to fill the corner of the first recess 105 with the second insulating material 116 without voids. Furthermore, when the void is exposed by the damaged insulating liner 112, the subsequently formed polycrystalline silicon may enter the void. As a result, leakage current may be caused, thereby reducing the yield of the non-volatile memory device 100. On the other hand, when the first insulating material 114 includes a polymer material, because the etching resistance at different positions tends to be different, the above-mentioned voids may be randomly present in some of the first recesses 105. Therefore, the reliability of the non-volatile memory device 100 is reduced.

In some embodiments of the present invention, prior to forming the first recesses 105, the implantation process 110 is performed to implant the second dopant into the insulating liner 112 and the first insulating material 114. Therefore, the structure of the first insulating material 114 may be made loose, and the etching rate of the first insulating material 114 at different positions during the subsequent etching process tends to be uniform. As a result, the bottom of the first recess 105 (i.e., the top surface of the first insulating material 114 in FIG. 1B) is substantially flat, thereby preventing the generation of the above-mentioned voids. Thus, the yield and reliability of the non-volatile memory device 100 can be improved.

In some embodiments, the second dopant may include phosphorus, nitrogen, arsenic, another suitable dopant, or a combination thereof. In some embodiments, in order for the first insulating material 114 to have more looseness and better insulating properties, the implant concentration of the second dopant is $10^9$-$10^{14}$ atoms/cm$^3$. In other embodiments, the implant concentration of the second dopant is $10^{11}$-$10^{12}$ atoms/cm$^3$.

On the other hand, in the step shown in FIG. 1A, when the sacrificial layer 106 is patterned to form the trenches, because the depth of the trench is relatively high, the top width of the patterned sacrificial layer 106 is usually smaller than the bottom width of the patterned sacrificial layer 106. Because the position of the second recess 115 corresponds to the position of the patterned sacrificial layer 106, if the top width of the second recess 115 is also smaller than the bottom width of the second recess 115, seams may be formed in the subsequently filled first polycrystalline silicon layer 122. As a result, the electrical resistance value of the first polycrystalline silicon layer 122 is increased, and therefore, the electrical performance and yield of the non-volatile memory device 100 is reduced.

In some embodiments of the present invention, prior to forming the second recesses 115, the implantation process 120 is performed to implant the third dopant into the second insulating material 116, and therefore the structure of the second insulating material 116 becomes loose and easily to be etched. As a result, the top width of the second recess 115 is greater than the top width of the sacrificial layer 106. In some embodiments, as shown in FIG. 1D, the top width W1 of the second recess 115 is equal to the bottom width W2 of the second recess 115. In other words, the second insulating material 116 and the subsequently formed first polycrystalline silicon layer 122 may have substantially vertical sidewalls. In other embodiments, the top width W1 of the second recess 115 is greater than the bottom width W2 of the second recess 115. In other words, the sidewalls of the subsequently formed first polycrystalline silicon layer 122 may have a cross-sectional profile that tapers toward the substrate 102. As a result, the generation of the above-mentioned seams can be avoided, and the electrical performance and yield of the non-volatile memory device 100 can be improved.

In some embodiments, the third dopant may include phosphorus, nitrogen, arsenic, another suitable dopant, or a combination thereof. In some embodiments, in order for the second insulating material 116 to have more looseness and better insulating properties, the implant concentration of the third dopant is $10^9$-$10^{14}$ atoms/cm$^3$. In other embodiments, the implant concentration of the third dopant is $10^{11}$-$10^{12}$ atoms/cm$^3$.

In addition, when the first etching process and/or the second etching process are performed, because the concentration of the etching gas may be different at different positions, the top surfaces of the isolation structures in the array region 10 may not be level with each other. As a result, the variation of the threshold voltage of the memory cell is increased, which may result in errors during operations. With the miniaturization of the non-volatile memory device 100, such problems will become more serious.

In some embodiments of the present invention, the implantation process 130 is performed before the second etching process, and the annealing process is performed after the second etching process. Because the high temperature process (for example, an annealing process or other process having a temperature above 500° C.) may result in the diffusion of the first dopant, and it is difficult to control the first dopant having the maximum concentration at the first depth D1. If the annealing process is performed before the first etching process, the subsequent etching process cannot stop at the first depth D1, thereby making the surfaces of the subsequently completed isolation structures uneven. As a result, the electrical performance, yield and reliability of the non-volatile memory device 100 will be reduced. In the present invention, because the annealing process has not been performed yet during the second etching process, the first dopant can be concentrated at the specific depth of the first polycrystalline silicon layer 122 and the isolation structures. In some embodiments, the first dopant has a maximum concentration at a location of the first depth D1 of the first polycrystalline silicon layer 122 and the isolation structures. In such an embodiment, the etching rate at the first depth D1 may be significantly reduced when the first etching process and/or the second etching process are performed. In other words, the etching process will stop at the first depth D1. As a result, the variation of the etching depth of the isolation structures in the array region 10 can be reduced, and therefore, the electrical performance, yield, and reliability of the non-volatile memory device 100 can be improved.

In some embodiments, the first dopant may include phosphorus, nitrogen, arsenic, another suitable dopant, or a combination thereof. In some embodiments, in order to make the first polycrystalline silicon layer 122 have better conductivity, in order to make the etching depth of the isolation structures more uniform, and in order to avoid the errors caused by the first dopant diffusing into the substrate 102, the implant concentration of the first dopant is $10^{10}$-$10^{18}$ atoms/cm$^3$. In other embodiments, the implant concentration of the first dopant is $10^{12}$-$10^{16}$ atoms/cm$^3$.

Furthermore, in order for the first insulating material 114 and the second insulating material 116 to have more looseness and better insulating properties, and in order for the first polycrystalline silicon layer 122 to have better conductivity and be a more effective etch stop layer, in some implementations, the ratio (C1/C2) of the implant concentration C1 of the first dopant to the implant concentration C2 of the second dopant is 10-10000. In other implementations, the ratio (C1/C2) of the implant concentration C1 of the first dopant to the implant concentration C2 of the second dopant is 100-1000. In some implementations, the ratio (C1/C3) of the implant concentration C1 of the first dopant to the implant concentration C3 of the third dopant is 10-10000. In other implementations, the ratio (C1/C3) of the implant concentration C1 of the first dopant to the implant concentration C3 of the third dopant is 100-1000.

A non-volatile memory device 100 is provided in some embodiments of the present invention. Referring to FIG. 1I, the non-volatile memory device 100 may include the substrate 102, the tunneling oxide layer 104, a plurality of isolation structures, the first polycrystalline silicon layer (floating gate) 122, the dielectric layer 132, and the second polycrystalline silicon layer (control gate) 142.

These isolation structures are formed in the substrate 102, and each isolation structure has a substantially flat top surface. In the array region 10, the isolation structures have substantially the same height with each other, and each of the isolation structures includes the insulating liner 112, the first insulating material 114, and the second insulating material 116. The first insulating material 114 has a substantially flat top surface. In the peripheral region 20, each of the isolation structures includes the insulating liner 112 the first insulating material 114. The top surface of the isolation structure in the peripheral region 20 is higher than the top surface of the isolation structure in the array region 10. The first insulating material 114 has a substantially flat top surface. As described above, by providing the isolation structure with a substantially flat top surface, the generation of the above-described void can be avoided, and therefore, the yield and reliability of the non-volatile memory device 100 can be improved.

The first polycrystalline silicon layer 122 is formed on the substrate 102 and between two adjacent isolation structures. The sidewalls of the first polycrystalline silicon layer 122 are substantially perpendicular to the top surface of the substrate 102. As described above, the sidewalls of the first polycrystalline silicon layer 122 has a vertical cross-sectional profile or a tapered profile that tapers downward, which can avoid the generation of the above-mentioned seams. As a result, the electrical performance and yield of the non-volatile memory device 100 can be improved.

Figure 2:
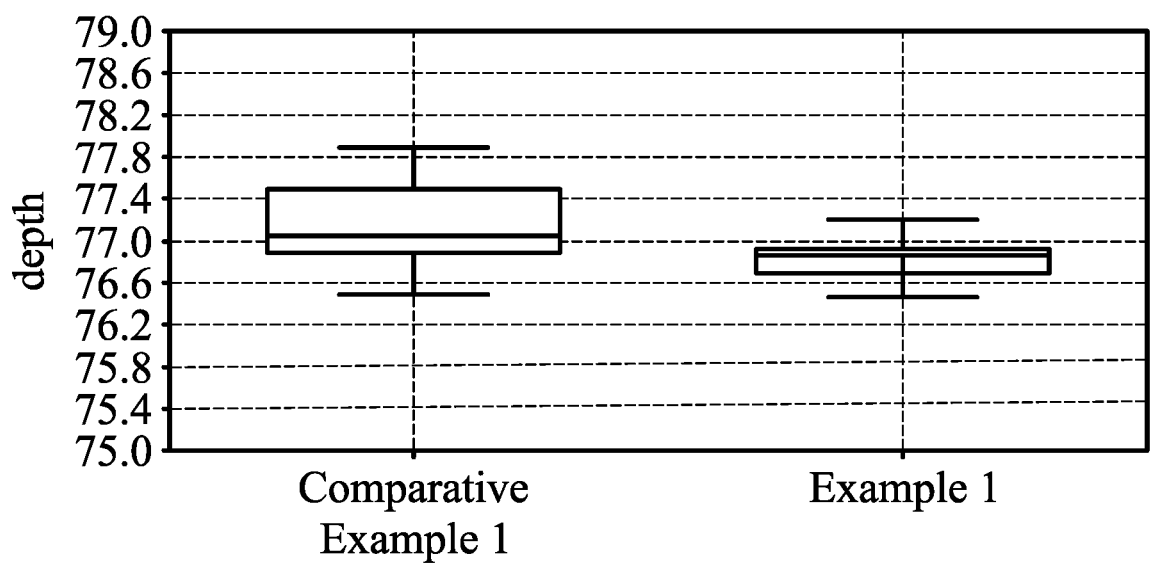
FIG. 2 shows experimental results of the recess depth variation of the shallow trench isolation structures in the non-volatile memory devices of Comparative Example 1 and Example 1.

In order to verify the effect of the annealing process on the etch stop ability of the first dopant, the inventors of the present invention have conducted experiments and the results are shown in FIG. 2. FIG. 2 shows experimental results of the recess depth variation of the shallow trench isolation structures in the non-volatile memory devices of Comparative Example 1 and Example 1.

The non-volatile memory device of Example 1 was manufactured in accordance with the steps described in the above-mentioned FIGS. 1A-1H, and the annealing process was performed on the non-volatile memory device after the structure shown in FIG. 1H had been formed. The non-volatile memory device of Comparative Example 1 was manufactured in accordance with the steps similar to the steps of Example 1, except that the annealing process of Comparative Example 1 was performed after the implantation process 130 and before the first etching process shown in FIG. 1G. Fifteen positions were randomly selected for both the non-volatile memory devices of Example 1 and Comparative Example 1, and the etching depths of the first recesses 105 were measured, and the statistical results of the etching depths were shown in FIG. 2.

In FIG. 2, if the difference between the maximum value and the minimum value of the etching depths is larger, it means that the variation of etching depth is greater. In other words, if the difference between the maximum value and the minimum value of the etching depths is smaller, it means that the height uniformity of the isolation structures is better.

Referring to FIG. 2, for the non-volatile memory device of Comparative Example 1, the difference between the maximum value and the minimum value of the etching depths is about 1.4 nm. For the non-volatile memory device of Example 1, the difference between the maximum value and the minimum value of the etching depths is about 0.8 nm.

From the above experimental results, it has been verified that the variation of etching depth can be significantly reduced by performing the etching process before the annealing process. Therefore, the variation of the threshold voltage of the memory cell can be reduced, and the electrical performance, yield, and reliability of the non-volatile memory device 100 can be improved.

As described above, the advantages of the non-volatile memory device and the method for manufacturing the non-volatile memory device in accordance with the embodiments of the present invention include at least:

(1) By implanting the second dopant into the insulating liner and the first insulating material, the first insulating material has a substantially flat top surface. As a result, the generation of the above-mentioned void can be avoided, and the yield and reliability of the non-volatile memory device can be improved.

(2) By implanting the third dopant into the second insulating material, the subsequently formed first polycrystalline silicon layer has a substantially vertical cross-sectional profile or a tapered profile that tapers downward. As a result, the generation of the above-mentioned seams can be avoided, and the electrical performance and yield of the non-volatile memory device can be improved.

(3) By performing the etching process before the annealing process, the variation of etching depth can be significantly reduced. As a result, the variation of the threshold voltage of the memory cell can be reduced, and the electrical performance, yield, and reliability of the non-volatile memory device can be improved.

(4) By performing the annealing process after the etching process, the first dopant is uniformly diffused into the first polycrystalline silicon layer. As a result, the electrical resistance value of the first polycrystalline silicon layer is reduced, and the first polycrystalline silicon layer can be used as a floating gate.

(5) By simultaneously implanting the first dopant into the isolation structures and the first polycrystalline silicon layer, the uniformity of etching depth of the isolation structures is improved and the conductivity of the first polycrystalline silicon layer is also improved. In addition, the processes of the non-volatile memory device is simplified.

(6) The implantation processes that use the first dopant, the second dopant, and the third dopant can be easily integrated into existing processes of the non-volatile memory device without substantial modification or replacement of process and/or production equipment. Therefore, the effect on the cost of production is small.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A method for manufacturing a non-volatile memory device, comprising:
   forming a plurality of isolation structures in a substrate;
   forming a first polycrystalline silicon layer in the substrate and between two adjacent isolation structures;
   performing a first implantation process to implant a first dopant into the first polycrystalline silicon layer and the isolation structures;
   partially removing a portion of each of the isolation structures so that a remaining portion of each of the isolation structures has a substantially flat top surface, wherein the removed portion of the isolation structures contains the first dopant;
   performing an annealing process to uniformly diffuse the first dopant in the first polycrystalline silicon layer after partially removing the isolation structures;
   forming a dielectric layer on the first polycrystalline silicon layer; and
   forming a second polycrystalline silicon layer on the dielectric layer.

2. The method for manufacturing the non-volatile memory device as claimed in claim 1, wherein the first dopant has a maximum concentration at a first depth of the isolation structures.

3. The method for manufacturing the non-volatile memory device as claimed in claim 1, wherein the first dopant comprises phosphorus, nitrogen or arsenic.

4. The method for manufacturing the non-volatile memory device as claimed in claim 2, wherein partially removing the isolation structures comprises:
   forming a mask layer covering the isolation structures located in a peripheral region, wherein the mask layer does not cover the isolation structures located in an array region;
   performing a first etching process to partially remove the isolation structures located in the array region so that top surfaces of the isolation structures located in the array region are higher than the first depth;
   removing the mask layer; and
   performing a second etching process to partially remove the isolation structures, wherein a top surface of the remaining portion of each of the isolation structures located in the array region is substantially level with the first depth, and a top surface of the remaining portion of each of the isolation structures located in the peripheral region is higher than the top surface of the remaining portion of each of the isolation structures located in the array region.

5. The method for manufacturing the non-volatile memory device as claimed in claim 1, wherein after the first implantation process and before the annealing process, a process with a process temperature higher than 500° C. is not performed.

6. The method for manufacturing the non-volatile memory device as claimed in claim 1, wherein forming the isolation structures comprises:
   forming a sacrificial layer on the substrate;
   patterning the sacrificial layer and the substrate to form a plurality of trenches in the substrate;
   conformally forming an insulating liner on the substrate and in the trenches;
   forming a first insulating material in the trenches;
   performing a planarization process so that a top surface of the sacrificial layer, a top surface of the insulating liner, and a top surface of the first insulating material are level with one another;
   performing a second implantation process to implant a second dopant into the insulating liner and the first insulating material; and
   partially removing the insulating liner and the first insulating material to form a plurality of first recesses in the sacrificial layer.

7. The method for manufacturing the non-volatile memory device as claimed in claim 6, wherein the first insulating material located at the bottom of the first recesses have substantially flat top surfaces.

8. The method for manufacturing the non-volatile memory device as claimed in claim 6, wherein the second dopant comprises phosphorus, nitrogen or arsenic.

9. The method for manufacturing the non-volatile memory device as claimed in claim 6, wherein a ratio of an implant concentration of the first dopant to an implant concentration of the second dopant is 10-10000.

10. The method for manufacturing the non-volatile memory device as claimed in claim 6, wherein forming the isolation structures further comprises:
    forming a second insulating material in the first recesses;
    performing a third implantation process to implant a third dopant into the second insulating material; and
    removing the sacrificial layer and partially removing the insulating liner and the second insulating material to form the isolation structures which comprise the insulating liner, the first insulating material, and the second insulating material, and to form a second recess between two adjacent isolation structures, wherein a top width of the second recess is greater than or equal to a bottom width of the second recess.

11. The method for manufacturing the non-volatile memory device as claimed in claim 10, wherein the third dopant comprises phosphorus, nitrogen or arsenic.

12. The method for manufacturing the non-volatile memory device as claimed in claim 10, wherein a ratio of an implant concentration of the first dopant to an implant concentration of the third dopant is 10-10000.

* * * * *